United States Patent
Zhong et al.

[11] Patent Number: 5,966,625
[45] Date of Patent: Oct. 12, 1999

[54] METHOD FOR MAKING A SLANT-SURFACE SILICON WAFER HAVING A RECONSTRUCTED ATOMIC-LEVEL STEPPED SURFACE STRUCTURE

[75] Inventors: Lei Zhong, Kanagawa; Norihiro Shimoi, Niigata; Yoshio Kirino, Kanagawa, all of Japan

[73] Assignee: Toshiba Ceramics Co., Ltd., Tokyo, Japan

[21] Appl. No.: 09/187,038

[22] Filed: Nov. 6, 1998

Related U.S. Application Data

[62] Division of application No. 08/616,908, Mar. 19, 1996.

[30] Foreign Application Priority Data

| Mar. 20, 1995 | [JP] | Japan | 7-087593 |
| Mar. 20, 1995 | [JP] | Japan | 7-087594 |
| Mar. 20, 1995 | [JP] | Japan | 7-087595 |

[51] Int. Cl.$^6$ .................................................. H01L 21/20
[52] U.S. Cl. .................... 438/492; 438/503; 438/507; 117/85; 117/90
[58] Field of Search ............................................ 438/492

[56] References Cited

U.S. PATENT DOCUMENTS

| 4,564,416 | 1/1986 | Homma et al. ................... 156/617 SP |
| 4,803,173 | 2/1989 | Sill et al. . | |
| 4,931,132 | 6/1990 | Aspnes et al. ........................... 156/601 |
| 4,987,094 | 1/1991 | Colas et al. . | |
| 5,141,893 | 8/1992 | Ito et al. ................................... 437/81 |
| 5,212,404 | 5/1993 | Awano . | |
| 5,230,768 | 7/1993 | Furukawa et al. . | |
| 5,589,421 | 12/1996 | Miyashita et al. ........................ 437/225 |

FOREIGN PATENT DOCUMENTS 3 617 927  12/1986  Germany .

OTHER PUBLICATIONS

D.J. Chadi, "Stabilities of Single–Layer Bilayer Steps on Si(001) Surfaces", *Physical Review Letters,* vol. 59, No. 15, Oct. 12, 1987, pp. 1691–1694.

Nobuhiko Sato et al., "Hydrogen Annealed Silicon–on–Insulator", *Applied Physics Letters,* vol. 65, No. 15, Oct. 10, 1994, pp. 1924–1926.

English Language Derwent abstract of DE 3 617 927.

Akiko Natori, et al., "Step Structure Transformation of Si(001) Surface Induced by Current," *Japanese Journal of Applied Physics,* vol. 31, 1992, pp. 1164–1169.

B.S. Swartzentruber, "Scanning tunneling microscopy studies of structural disorder and steps on Si surfaces," *Journal of Vacuum Science & Technology* A, vol. 7A, No. 4, Jul./Aug. 1989, pp. 2901–2905.

*Primary Examiner*—Olik Chaudhuri
*Assistant Examiner*—Douglas A. Wille
*Attorney, Agent, or Firm*—Finnegan, Henderson, Farabow, Garrett & Dunner, L.L.P.

[57] ABSTRACT

A single crystal silicon wafer is sliced off so as to have a slant surface that is inclined from plane (001) such that the normal of the slant surface is inclined by 0.01° to 0.2° from direction [001] toward direction [110]. After being cleaned, the silicon wafer is heat-treated at 600–1,300° C. for not less than 1 minute in an ultrapure argon or hydrogen atmosphere containing nitrogen at not more than 0.1 ppm, to thereby cause the slant surface to have a stepped crystal surface structure. The stepped crystal surface structure is constituted of step walls Sa and Sb when it has been formed by a heat treatment in an argon atmosphere, and substantially all of its step walls are of a type Sb when it has been formed by a heat treatment in a hydrogen atmosphere.

4 Claims, 6 Drawing Sheets

METHOD FOR MAKING A SLANT-SURFACE SILICON WAFER HAVING A RECONSTRUCTED ATOMIC-LEVEL STEPPED SURFACE STRUCTURE

This is a division of application Ser. No. 08/616,908, filed Mar. 19, 1996, which is incorporated herein by reference.

BACKGROUND OF THE INVENTION

1. Field of the Invention

The present invention relates to a slant-surface silicon wafer and a manufacturing method of its surface structure. More specifically, the invention relates to a slant-surface silicon wafer for a semiconductor device which has a slant surface of a particular structure and provides superior characteristics to an oxide film formed thereon, as well as to a manufacturing method of such a slant surface.

The invention also relates to a semiconductor device and, more specifically, to a high-performance semiconductor device which is constructed such that electrons move in a particular direction determined in accordance with the surface structure of a slant-surface silicon wafer.

2. Description of the Related Art

It is well known that the surface state of a silicon wafer influences defects and a breakdown voltage of an oxide film formed thereon. In this connection, various techniques have been proposed. Among those techniques are making the surface as clean as possible, and reconstructing a crystal surface structure of atomic-level dislocations. The latter techniques include repeated degassing in an ultrahigh vacuum (see Journal of Vacuum Science Technology, Vol. 7A, pp. 2901–2905, 1989), and current conduction heating in a particular direction (see Japanese Journal of Applied Physics, Vol. 31, pp. 1164–1169, 1992).

Conventionally, such a crystal surface structure is observed by using a scanning tunnel microscope (STM) or an analyzing device of reflection high energy electron diffraction (RHEED).

However, to observe a crystal surface structure by STM or RHEED, it is necessary to remove a native oxide film formed on a silicon surface: observation is conducted after a native oxide film is removed by subjecting a wafer to a high-temperature treatment in an ultrahigh vacuum of a pressure lower than $10^{-8}$ Pa. During this procedure, if the pressure becomes higher than $10^{-6}$ Pa, the surface is re-oxidized to make it difficult to observe the reconstructed surface.

In view of the above problems of the conventional techniques in reconstructing a silicon wafer crystal surface and confirming its reconstruction, the present inventors have found a method capable of easily reconstructing a crystal surface as well as easily recognizing the state of the reconstructed crystal surface. Further, the inventors have eagerly studied to realize a method of forming, on an industrial scale, silicon wafers having a crystal surface which enables formation of a high-quality thermal oxidation film that has only a small number of thermal-oxidation-induced stacking faults and has a high breakdown voltage while controlling the state of the crystal surface.

As a result, the inventors have found that by performing a high-temperature heat treatment in an ultrapure argon or hydrogen gas containing nitrogen at not more than 0.1 ppm, a native oxide film formed on a wafer surface can be decomposed as well as the wafer can be degassed, so that a surface can be reconstructed.

Further, in the conventional methods, since a wafer is exposed to the air from the end of a high-temperature heat treatment to the start of observation and analysis, a native oxide film is again formed thereon. Since the native oxide film is an insulator, in such analyzing methods as STM the native oxide film may render an analysis incorrect. In contrast, the inventors have found that by forming not only a slant surface that is inclined in a particular direction by a very small angle but also an atomic-level stepped structure, a reconstructed surface structure can be recognized easily, that is, it can be analyzed with an interatomic force microscope (AFM). The inventors have also found that the above technique enables estimation of the state of a reconstructed crystal surface of a wafer even if a native oxide film is formed at a certain thickness.

Turning now to the device aspect, when silicon wafers are used as substrates for various semiconductor devices, an oxide film is formed thereon as a kind of protection film for preventing dislocations and slips from occurring in the silicon crystal. An oxide film is required to be homogeneous and have a uniform flat surface. Properties of an oxide film are mainly influenced by the surface orientation and the surface state of a silicon wafer, though they are also influenced by the oxidizing method and apparatus. Therefore, an oxide film is formed by employing a given surface orientation, and performing careful cleaning, a heat treatment, and other treatments.

However, to manufacture a semiconductor device, it is not conventional at present that after the above processes a channel and a gate, for instance, are formed on a selected portion of a stepped crystal surface structure of a silicon wafer substrate.

SUMMARY OF THE INVENTION

The present invention has been made based on the above-mentioned findings, and has an object of providing a silicon wafer having an observable stepped surface structure capable of being produced industrially and a method for forming such a surface structure.

Another object of the Invention is to improve the electron transport performance that influences, for instance, a switching function of a semiconductor device such as a MOS device in an integrated circuit or the like by utilizing a stepped crystal structure of a slant-surface silicon wafer. Such a crystal structure of a silicon wafer has not been utilized conventionally for the above purpose, but first done so by the present inventors.

According to a first aspect of the invention, there is provided a slant-surface silicon wafer comprising a slant surface that is inclined from plane (001) such that a normal of the slant surface is inclined by 0.01° to 0.2° from direction [001] toward direction [110], the slant surface having a stepped crystal surface structure including step walls Sa and Sb that are high in regularity. It is preferred that formation 10 of the stepped crystal structure has been confirmed by an observation with an interatomic force microscope.

According to the first aspect of the invention, there is also provided a method for forming a slant-surface silicon wafer, comprising the steps of slicing off a single crystal silicon wafer comprising a slant surface that is inclined from plane (001) such that a normal of the slant surface is inclined by 0.01° to 0.2° from direction [001] toward direction [110]; cleaning the silicon wafer; and heat-treating the silicon wafer at 600–1,300° C. for not less than 1 minute in an ultrapure argon atmosphere containing nitrogen at not more than 0.1 ppm, to thereby cause the slant surface to have a stepped crystal surface structure including step walls Sa and Sb. It is preferred that the above method further comprises the step of confirming formation of the stepped crystal structure by an observation with an interatomic force microscope.

The step wall Sa as mentioned above means an atomic step wall, among several types of atomic step walls occurring on a silicon wafer slant surface, that is defined by Chadi as having a height equal to that of a single-atom layer and extending parallel with silicon atom rows in the corresponding step layer (see Physical Review Letters, Vol. 59, pp. 1,691, 1987 (hereinafter referred to as Report (1)). The step wall Sb means an atomic step wall that is defined as a height equal to that of a single-atom layer and extending perpendicularly to silicon atom rows in the corresponding step layer.

Figure 1:
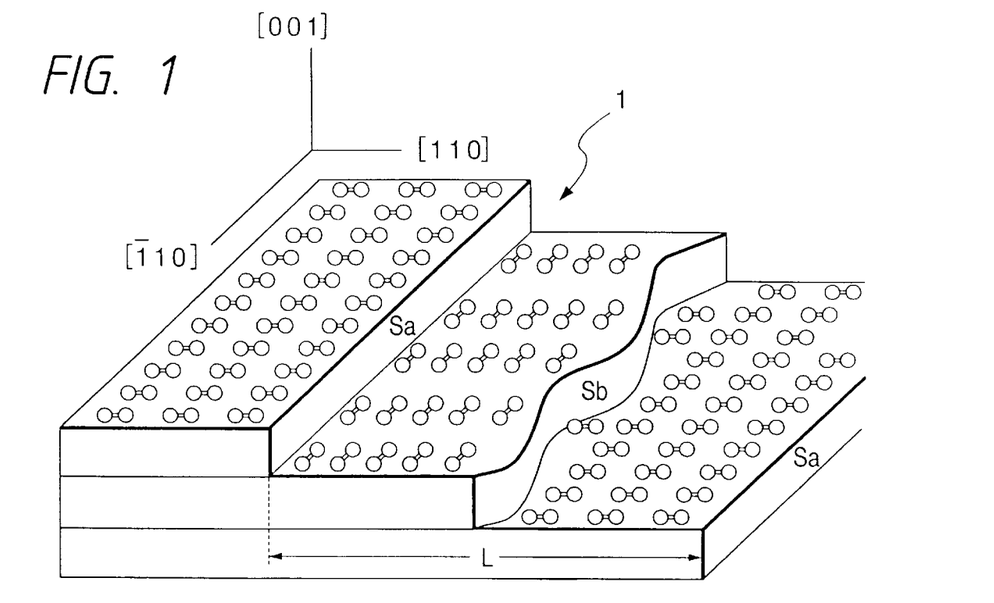
FIG. 1 schematically illustrates a surface structure of slant-surface silicon wafer according to a first embodiment of the present invention.

The terms steps Sa and Sb used in this specification are according to Chadi's definitions. FIG. 1 schematically illustrates a surface structure of the slant-surface silicon wafer according to the first aspect of the invention. Referring to FIG. 1, in a silicon wafer 1, a stepped structure including step walls Sa and Sb is forced by inclining the surface from plane (001) such that its normal is inclined toward a particular direction, for instance, direction [110], by an inclination angle θ of 0.01° to 0.2°. Flat step walls Sa and curved stop walls Sb are generally parallel with each other. An interval L between two adjacent step walls Sa is determined by the inclination angle θ, and expressed as L=2×{(lattice constant/4}/tan θ.

According to a second aspect of the invention, there is provided a slant-surface silicon wafer comprising a slant surface that is inclined from plane (001) such that a normal of the slant surface is inclined by 0.01° to 0.2° from direction [001] toward direction [110], the slant surface having a stepped crystal surface structure substantially all of whose step walls are step walls Sa that are high in regularity. It is preferred that formation of the stepped crystal structure has been confirmed by an observation with an interatomic force microscope.

According to the second embodiment of the invention, there is also provided a method for forming a slant-surface silicon wafer, comprising the steps of slicing off a single crystal silicon wafer comprising a slant surface that is inclined from plane (001) such that a normal of the slant surface is inclined by 0.01° to 0.2° from direction [001] toward direction [110]; cleaning the silicon wafer; and heat-treating the silicon wafer at 600–1,300° C. for not less than 1 minute in an ultrapure hydrogen atmosphere containing nitrogen at not more than 0.1 ppm, to thereby cause the slant surface to have a stepped crystal surface structure substantially all of whose step walls are step walls Sa. It is preferred that the above method further comprises the step of confirming formation of the stepped crystal structure by an observation with an interatomic force microscope.

Figure 4:
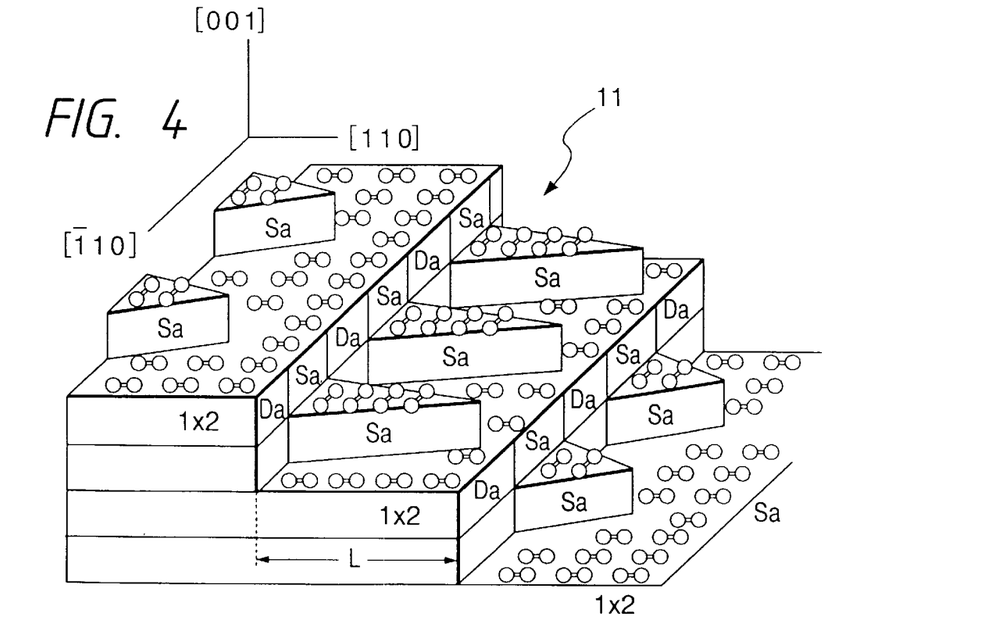
FIG. 4 schematically illustrates a surface structure of the slant-surface silicon wafer according to a second embodiment of the invention.

Report (1) also defines atomic step walls Da and Db in the same manner as the steps Sa and Sb except that the step walls Da and Db have a height equal to that of a double-atom layer. The terms steps Da and Db used in this specification are according to these definitions by Chadi. FIG. 4 schematically illustrates a surface structure of the slant-surface silicon wafer according to the second aspect of the invention. Referring to FIG. 4, in a silicon wafer 11, a stepped structure including step walls Sa and Da is formed by inclining the wafer surface from plane (001) such that its normal is inclined toward a particular direction, for instance, direction [110], by an inclination angle θ of 0.01° to 0.2°. On step layers corresponding to step walls Sa and Da, triangular step layers are arranged at certain intervals so that inclined sides of each triangular step layer are step walls Sa. Flat step walls each constituted of step walls Sa and Da are parallel with each other. An interval L between two adjacent flat step walls is determined by the inclination angle θ, and expressed as L={(lattice constant)/2}/tan θ.

According to a third aspect of the invention, there is provided a semiconductor device comprising a slant-surface silicon wafer as a substrate having a stepped crystal surface structure that has been reconstructed by cleaning and heat-treating, in a predetermined atmosphere, a silicon wafer that has been sliced off at an inclination angle of 0.01° to 5° toward a given crystal direction; and a carrier transport region formed in a single step layer of the stepped crystal surface structure.

In the above semiconductor device, it is preferred that a surface of the slant-surface silicon wafer be inclined from lane (001) such that a normal of the surface is inclined from direction [001] toward direction [110]. It is also preferred hat the semiconductor device is a MOS device having a source, gate, and a drain arranged in the single step layer.

DESCRIPTION OF THE PREFERRED EMBODIMENTS

EMBODIMENT 1

According to the first aspect (embodiment) of the invention, which has been summarized above, by adjusting the inclination angle of a slant surface (the slant surface formation itself on a silicon wafer is common in the art) at a very small angle of 0.01° to 0.2°, it becomes possible to recognize an atomic-level stepped structure of a crystal surface with an AFM. This allows a judgment that an atomic-level stepped structure obtained has both step walls Sa and Sb. If desired, the surface structure can be controlled and adjusted.

For example, by forming a crystal surface while observing it, formation of step walls Sb, which likely renders the surface unstable, can be prevented, which likely renders the surface unstable. This stabilizes the surface and thereby allow improvements in the characteristics of an oxide file formed thereon.

According to the first aspect of the invention, since a surface is subjected to a heat treatment by using an ultrapure argon gas, the impurity concentration in the argon gas is very low, and the oxygen and water concentrations are equivalent to those of a conventional ultrahigh vacuum capable of degassing. With the additional feature that the nitrogen content is made very small, extremely inert nature of the argon gas can be maintained effectively and no reaction occurs with a silicon wafer surface at all. Thus, a crystal surface is reconstructed on the silicon wafer by the heat treatment, and an AFM observation can confirm that the surface has a stepped structure including step walls Sa and Sb.

It is well known from, for instance, STM observations that in general a crystal surface is reconstructed on a clean silicon wafer by a high-temperature heat treatment, and that the reconstructed crystal surface is constituted of dimers.

In this embodiment, a wafer crystal surface inclined from plane (001) such that its normal is inclined from direction [001] (normal of plane (001)) toward direction [100] is formed with an atomic-level stepped structure developing periodically in the inclination direction, which structure defines the inclination angle. Atomic-level steps are classified into two types in terms of height: a single-atom layer S (0.13 nm) and a double-atom layer D (0.27 nm). The two types of steps can be discriminated from each other based on the direction of rows of dimers in a step atom layer. According to Report (1) mentioned above, a step wall Sa extends parallel with the rows of dimers in the corresponding step atom layer, and a step wall Sb extends perpendicularly to the rows of dimers in the corresponding step atom layer. Therefore, a crystal surface inclined from plane (001) such that its normal is inclined from direction [001] (normal of plane (001)) toward direction [110] is constituted of four kinds of atomic-level step walls Sa, Sb, Da and Db.

In terms of Wood's notation that is frequently used as a simplified method, the atomic reconstruction type of a step layer of a step wall Sa in 1×2 and that of a step wall Sb is 2×1. In other words, there are relationships of (step Sa) (1×2→2×1) and (step Sb) (2×1→1×2). According to many observations, for instance, those described in above-mentioned Journal of Vacuum Science Technology, Vol. 7A, pp. 2,901, 1989, and Journal of Applied Physics, Vol. 31, pp. 1,164, 1992, a step wall Sa is flat and a step wall Sb is curved.

In this embodiment, there is no particular limitations on the type of a silicon wafer but there may be used various types of silicon wafers, for instance, a silicon wafer of plane (001) (equivalent to (100) that is commonly used in the art to refer to this group of equivalent planes) obtained by slicing a silicon single crystal that has been produced by the Czochralski method (CZ method).

In this embodiment, the inclined slicing angle of a silicon wafer from the normal of plane (001) toward direction [110] should be in a range of 0.01° to 0.2°. If the inclination angle is larger than 0.2°, a step form cannot be recognized and therefore cannot be controlled. On the other hand, at present, it is difficult to mechanically control the inclination angle in a range smaller than 0.01°.

If the inclining direction from direction [001] is not toward direction [110], no regular steps are formed. However, the inclining direction is not required to be exactly toward direction [110], but it suffices that the inclining direction is substantially toward-direction [110]. Specifically, the inclining direction may be deviated toward direction [110] by about ±2°.

In this specification, to facilitate understanding, direction [110] represents directions [110], [$\bar{1}$110], [$\bar{1}\bar{1}$0] and [1$\bar{1}$0], which are equivalent to each other. Therefore, inclinations toward any of these directions are included in the invention.

A wafer that has been sliced off with inclination is cleaned by a cleaning method of a known silicon wafer manufacturing process, for instance, a method using a mixture of hydrofluoric acid and nitric acid, and then subjected to a heat treatment in an ultrapure argon gas atmosphere. As described above, the ultrapure argon gas of this embodiment contain only a very small amount of impurities such as oxygen and water. In particular, the nitrogen content should be 0.1 ppm or less. If it is larger than 0.1 ppm, nitrogen reacts with silicon at a high temperature, to form a nitride film, which will obstruct reconstruction of a surface structure.

The heat treatment temperature is set at 600–1,300° C. A process temperature higher than 1,300° C. is not practical because the life of a quartz core tube is likely shortened. If the process temperature is lower than 600° C., atomic reconstruction of a silicon surface is not effected by an argon gas. The period of the heat treatment in an argon gas atmosphere may be set properly in accordance with the surface structure of a silicon wafer to be processed, the inclination angle, and the structure of a sliced surface. The heat treatment period may be set and controlled properly in accordance with an intended stepped structure. Usually it is set at 5–240 minutes.

In this embodiment, a stepped structure of a surface structure of a slant-surface silicon wafer is observed with an AFM. In this case, to produce a clear, easy-to-recognize AFM photograph, certain measures are needed such as minimizing the sample storage time and purging air by use of nitrogen.

EXAMPLE 1

Figure 2:
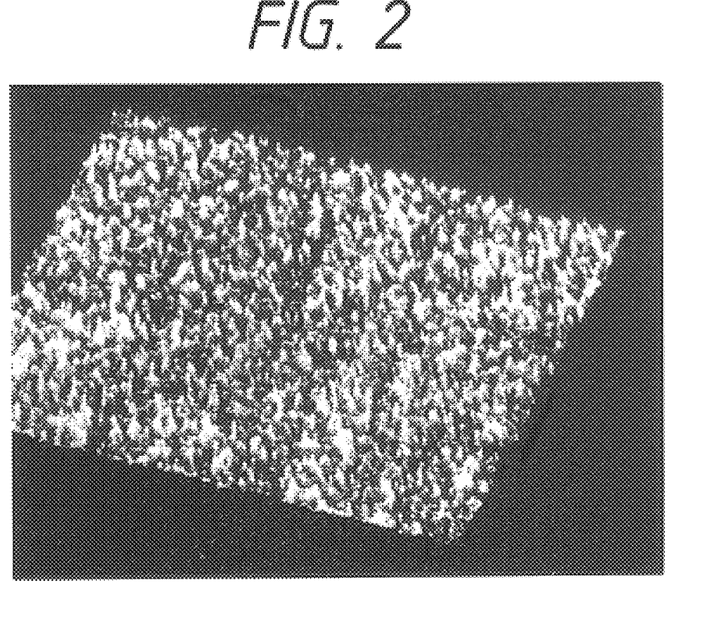
FIG. 2 is an AFM photograph showing a crystal surface structure of a mirror-polished slant-surface silicon wafer in Example 1.

Silicon wafer samples used in this example were those obtained by slicing a 6-inch CZ silicon crystal at an inclination angle of 0.05° from the normal of plane (001) toward direction [110]. After silicon wafer samples were cleaned by an ordinary cleaning method using, for instance, a mixture of hydrofluoric acid and nitric acid and then mirror-polished, they were observed with an AFM. FIG. 2 is an AFM photograph (field of view: 2 $\mu$m×2 $\mu$m) showing a crystal surface structure of a mirror-polished slant-surface wafer.

Further, the wafers were heat-treated at 1,200° C. for one hour in an argon gas atmosphere containing nitrogen at 0.01 ppm.

Figure 3A:
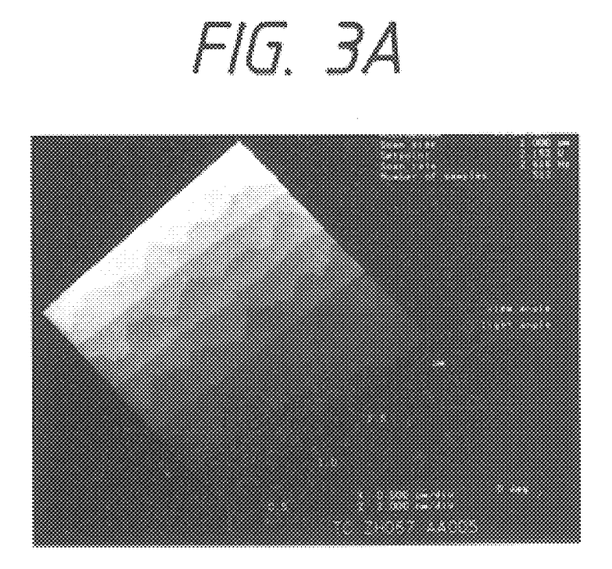
FIGS. 3A and 3B are AFM photographs showing a crystal surface structure of a slant-surface silicon wafer after being subjected to a heat treatment in Example 1.

FIG. 3A is an AFM photograph (field of view: 2 $\mu$m×2 $\mu$m) showing a crystal surface structure of a slant-surface wafer that has been subjected to the above heat treatment.

Figure 3B:
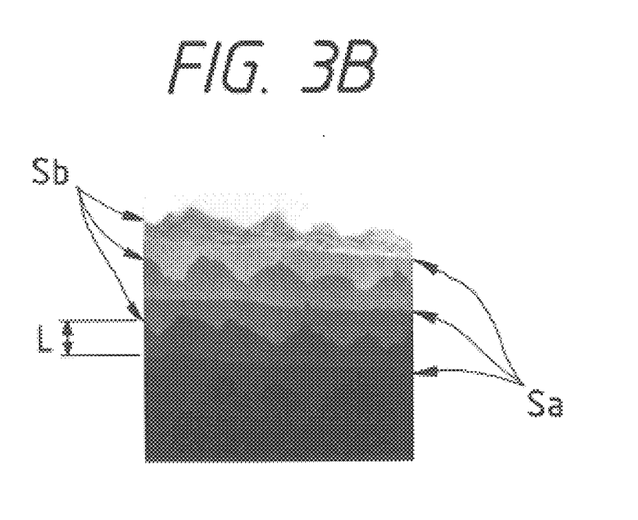

FIG. 3B is a photograph obtained by partially cutting away the photograph of FIG. 3A for convenience of description.

FIGS. 3A and 3B show that a crystal surface that is inclined from plane (001) such that its normal is inclined toward direction [110] includes flat step walls Sa and curved step walls Sb.

Since a domain length L between adjacent step walls is expressed as L=(height of atom layer)/tan α, where α is an inclination angle. Substituting α=0.5° and L=0.2 μm into this equation, the step wall height is calculated as 0.13 nm, which is equal to the height of a single-atom layer (a/4=0.13 nm, where a is a crystal lattice constant).

In the slant-surface silicon wafer according to this embodiment, a surface structure to become a stepped structure by being reconstructed by the heat treatment in an ultrapure argon atmosphere by virtue of the fact that the inclined slicing angle is made a given very small angle can be observed with an AFM. A desired stepped surface structure can be produced industrially while being observed and controlled. Therefore, a high-quality thermal oxidation film can be formed on such a stepped surface structure by, for instance, suppressing the formation of step walls Sb, which likely renders the surface unstable.

EMBODIMENT 2

According to the second aspect (embodiment) of the invention, which has been summarized above, an atomic-level stepped structure of a slant surface (the slant surface formation itself on a silicon wafer is common in the art) in mainly constituted of steps walls Sa. Since formation of step walls Sb is suppressed, the surface can be stabilized and the characteristics of an oxide film formed on such a surface can be improved.

By adjusting the inclination angle of a slant surface at a very small angle of 0.01° to 0.2°, it becomes possible to recognize an atomic-level stepped structure of a crystal surface with an AFM. This allows a judgment that an atomic-level stepped structure obtained is mainly constituted of step walls Sa. If desired, the surface structure can be controlled and adjusted.

According to the second aspect of the invention, since a surface is subjected to a heat treatment by using an ultrapure hydrogen gas, the impurity concentration in the argon gas is very low, and the oxygen and water concentrations are equivalent to those of a conventional ultrahigh vacuum capable of degassing. With the additional feature that the nitrogen content is made very small, a feature of the hydrogen gas that it easily allows reconstruction of a crystal surface of a silicon wafer can be maintained effectively. Thus, an AFM observation can confirm that a reconstructed stepped surface structure is mainly constituted of step walls Sa.

It has been first found by the inventors that by adjusting the inclination angle of a slant surface structure at a very small angle of 0.01° to 0.2°, cleaning the surface, and then subjecting the surface to a high-temperature heat treatment in an ultrapure hydrogen atmosphere, the slant surface structure is rendered stable and formation of steps walls Sb, which likely cause defects and the like in an oxide film, can thereby be suppressed.

It is well known, for Instance, from STM observations that in general a crystal surface is reconstructed on a clean silicon wafer by a high-temperature heat treatment, and that the reconstructed crystal surface is constituted of dimers.

A description will be made of how the inventors has reached this embodiment of the invention.

The inventors observed, with an AFM, a slant surface structure of a silicon wafer obtained by the conventional treatment, and found that a conventional silicon wafer slant surface that is inclined from plane (001) such that its normal is inclined by 1° to 5° from direction [001] (normal of plane 001)) toward direction [110] has a random stepped structure in which step walls Sa and Sb are mixed randomly.

On the other hand, above-mentioned Report (1) states that an energy for forming step walls Sa, $\lambda_{Sa}$=0.15±0.01 eV/a (a is a crystal lattice constant) is more than 10 times larger than an energy for forming step walls Sb, $\lambda_{Sb}$=0.01±0.01 eV/a. Based on this statement, the inventors have confirmed that the chemical activity is high at step walls Sb and the silicon wafer surface is therefore unstable there, and also have studied in search of a method for effectively suppressing formation of such step walls Sb as well as forming step walls Sa regularly.

It is well known that by subjecting a silicon wafer to a high-temperature heat treatment in a hydrogen atmosphere, the wafer surface is modified: silicon atoms on the wafer surface are removed. For example, Applied Physics Letters, Vol. 65, pp. 1,924, 1994 (hereinafter referred to as Report (2)) states that surface Silicon atoms are removed at a rate (etching rate) of 0.08 nm/min in a hydrogen atmosphere at 1,150° C.

However, in a process of reconstructing a stepped structure on a slant surface of a silicon wafer, the removal rate of atoms existing on step walls and that of atoms existing on surfaces of domains (i.e., regions other than step walls) should be different from each other. Further, the removal rate of atoms existing on step walls should depend on the structure and properties of the step walls. Based on this understanding, the inventors have studied properties of step walls and how silicon atoms behave when removed, and other items.

Specifically, first it was checked how silicon atoms behaved in their removal when a surface on which step walls Sa and Sb exist in a mixed state was subjected to a high-temperature treatment in an ultrapure hydrogen atmosphere. The inventors expected that the removal rate of silicon atoms existing on step walls Sb would be higher than that of silicon atoms existing on step walls Sa.

It is known that in general silicon atoms on a silicon wafer surface constitute dimers. Surface dimers are removed by the following two methods. In a first method, two atoms of a dimer are removed together and therefore dimer decomposition is not needed. In a second method, a dimer is decomposed first and then two atoms that previously constituted the dimer are removed separately.

According to Chadi's definition as mentioned above, dimer rows in a step layer corresponding to a step wall Sa extend parallel with the step wall Sa, and dimers themselves are parallel with the step wall Sa. Therefore, one of the two silicon atoms of a dimer existing on a step wall Sa is exposed while the other silicon atom exists inside the domain. The two atoms in different environments in a crystal structure are entirely different in chemical activity. Therefore, to remove silicon atoms existing on a step wall Sa, dimers need to be decomposed immediately before removal of the dimers. Thus, silicon atoms existing on a step wall Sa are hard to remove.

On the other hand, diner rows in a step layer corresponding to a step wall Sb extend perpendicularly to the step wall Sb, and diners themselves are parallel with the step wall Sb. Since the two silicon atoms of a dimer existing on a step Sb are in the same crystal environment, they can be removed at the same time without decomposing the dimer.

It is understood from the above that two silicon atoms, i.e., one dimer on a step wall Sb can be removed by cutting four equivalent Si—Si bonds that are exposed. In the case of silicon atoms existing on a step wall Sa, to remove one silicon atom, it is necessary to cut four non-equivalent Si—Si bonds: one exposed, one existing in the bulk, and two coupled with other dimers.

It is understood from the above that if a slant surface stepped structure of a silicon wafer has only step walls Sa, the silicon wafer will have a stable surface structure. Further, step walls Sb in a stepped surface structure can be removed more easily by a hydrogen treatment than step walls Sa. Therefore, a silicon wafer having a stable surface can be obtained by forming a slant surface structure, from which a stepped structure mainly constituted of step walls Sa can be reconstructed easily, and then subjecting the slant surface to a hydrogen treatment.

That is, utilizing the differences in chemical properties between step walls Sa and Sb, the inventors have succeeded in forming a stable silicon wafer surface that is free of step walls Sb by forming a slant surface having a given inclination angle and then subjecting it to a high-temperature heat treatment in an ultrapure hydrogen atmosphere, to thereby reduce defects in an oxide film and increase a breakdown voltage.

In this embodiment, there is no particular limitations on the type of a silicon wafer but there may be used various types of silicon wafers, for instance, a silicon wafer of plane (001) (equivalent to (100) that is commonly used in the art to refer to this group of equivalent planes) obtained by slicing a silicon single crystal that has been produced by the Czochralski method (CZ method).

In this embodiment, the inclined slicing angle of a silicon wafer from the normal of plane (001) toward direction [110] should be in a range of 0.01° to 0.2°. If the inclination angle is larger than 0.2°, a step form cannot be recognized and therefore cannot be controlled. On the other hand, at present, it is difficult to mechanically control the inclination angle in a range smaller than 0.01°.

If the inclining direction from direction [001] is not toward direction [110], no regular steps are formed. However, the inclining direction is not required to be exactly toward direction [110], but it suffices that the inclining direction is substantially toward direction [110]. Specifically, the inclining direction may be deviated toward direction [110] by about ±2°.

In this specification, to facilitate understanding, direction [110] represents directions [110], [$\bar{1}$10], [$\bar{1}\bar{1}$0] and [1$\bar{1}$0], which are equivalent to each other. Therefore, inclinations toward any of these directions are included in the invention.

A wafer that has been sliced off with inclination is cleaned by a cleaning method of a known silicon wafer manufacturing process, for instance, a method using a mixture of hydrofluoric acid and nitric acid, and then subjected to a heat treatment in an ultrapure hydrogen gas atmosphere. As described above, the ultrapure hydrogen gas of this embodiment contain only a very small amount of impurities such as oxygen and water. In particular, the nitrogen content should be 0.1 ppm or less. If it is larger than 0.1 ppm, nitrogen reacts with silicon at a high temperature, to form a nitride film, which will obstruct reconstruction of a surface structure.

The heat treatment temperature is set at 600–1,300° C. A process temperature higher than 1,300° C. is not practical because the life of a quartz core tube is likely shortened. If the process temperature is lower than 600° C., the rate of reaction between a silicon surface and hydrogen is low and therefore the efficiency of surface structure reconstruction is low. The period of the heat treatment in a hydrogen gas atmosphere may be set properly in accordance with the surface structure of a silicon wafer to be processed, the inclination angle, and the structure of a sliced surface. The heat treatment period may be set and controlled properly in accordance with the dynamics of removal and disappearance of step walls Sb. Usually it is set at 5–240 minutes.

In this embodiment, a stepped structure of a surface structure of a slant-surface silicon wafer is observed with an AFM. In this case, to produce a clear, easy-to-recognize AFM photograph, certain measures are needed such as minimizing the sample storage time and purging air by use of nitrogen.

EXAMPLE 2

Figure 5:
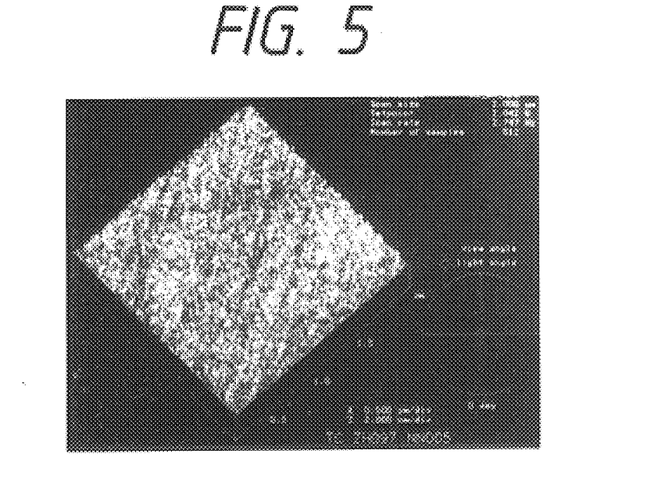
FIG. 5 is an AFM photograph showing a crystal surface structure of a mirror-polished slant-surface silicon wafer in Example 2.

Silicon wafer samples used in this example were those obtained by slicing a 6-inch CZ silicon crystal at an inclination angle of 0.05° from the normal of plane (001) toward direction [110]. After silicon wafer samples were cleaned by an ordinary cleaning method using, for instance, a mixture of hydrofluoric acid and nitric acid and then mirror-polished, they were observed with an AFM. FIG. 5 is an AFM photograph (field of view: 2 $\mu$m×2 $\mu$m) showing a crystal surface structure of a mirror-polished slant-surface wafer.

Further, the wafers were subjected to hydrogen heat treatment of 1,200° C. and one hour in an hydrogen gas atmosphere containing nitrogen at 0.01 ppm.

Figure 6A:
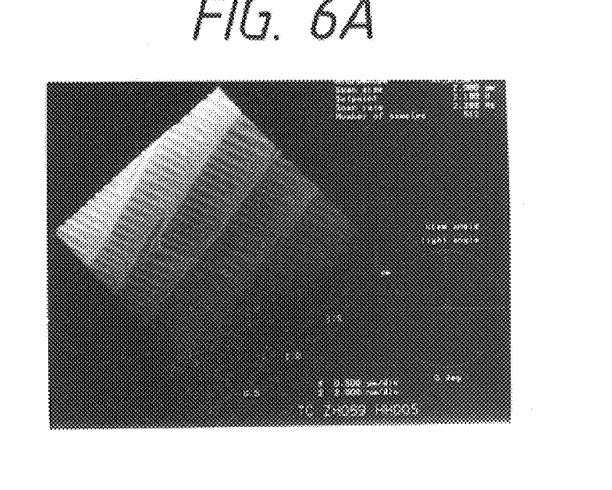
FIGS. 6A and 6B are AFM photographs showing a crystal surface structure of a slant-surface silicon wafer after being subjected to a heat treatment in Example 2.
Figure 6B:
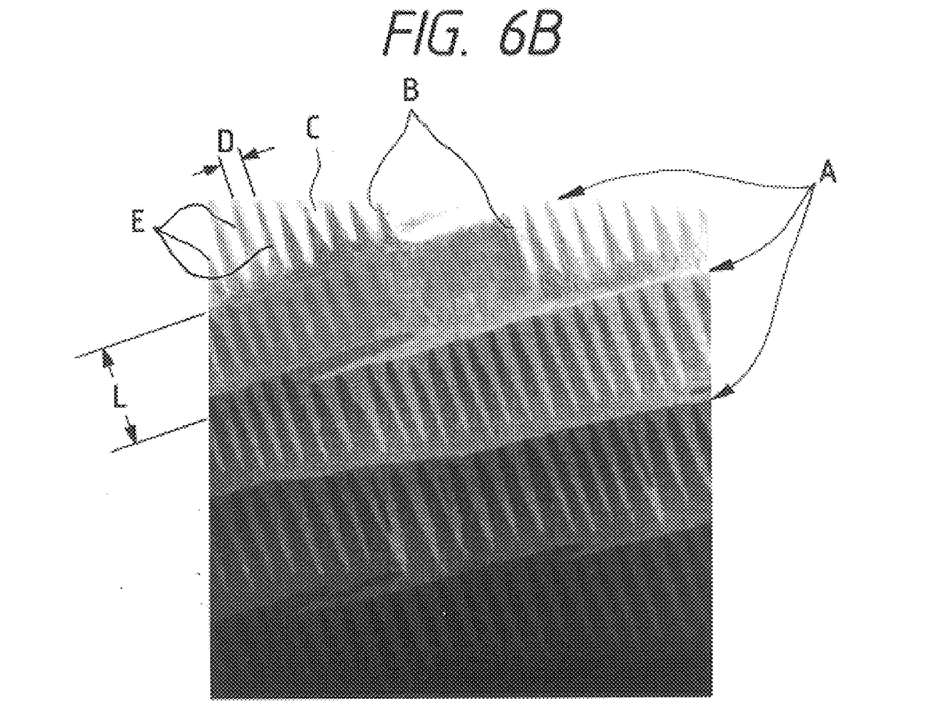

FIG. 6A is an AFM photograph (field of view: 2 $\mu$m×2 $\mu$m) showing a crystal surface structure of a slant-surface wafer that has been subjected to the above hydrogen heat treatment. FIG. 6B is a photograph obtained by enlarging a part of the AFM photograph of FIG. 6A for convenience of description. Referring to FIG. 6B, the observed stepped surface structure is characterized by a combination of straight lines A and folded lines B. An interval L between two adjacent straight lines A is approximately constant, and has the following relationship with a slicing inclination angle $\alpha$:

$$L = \text{(height of atom layer)}/\tan \alpha$$

By substituting L=0.31 $\mu$m and tan(0.05°) into the above equation, the atom layer height is calculated as 0.27 nm, which is approximately equal to a/2 where a is the silicon crystal lattice constant 0.52 nm. That is, the top surfaces of two step layers defined by adjacent straight lines A have a height difference of two atoms.

Actually, the folded lines B are not continuous, but are oblique sides of narrow rectangles C. A step layer represented by a straight line A excluding portions corresponding to bases D of triangles C is measured to have a height of two atoms, while a step layer represented by oblique sides E of rectangles C is measured to have a height of one atom. If FIG. 6B is viewed as a whole, it is understood that most of step layers have a height of one atom.

Thus, FIG. 6B indicates that 1-atom-height step walls represented by rectangles C are stable step walls Sa. According to Report (1) by Chadi, step walls represented by a straight line A excluding portions corresponding to bases D of triangles C are parallel with dimer rows in the corresponding step layer. These step walls are flat and are given a symbol Da. Step walls represented by bases D of rectangles C are given a symbol Sa. On the other hand, dimer rows in each rectangular step layer are perpendicular to a straight line A. Step walls represented by the two oblique sides of each rectangle C are also given a symbol Sa.

Thus, it is apparent that a slant surface structure of Example 2 is constituted substantially only of step walls Sa.

EXAMPLE 3 AND COMPARATIVE EXAMPLE 1

Silicon wafers obtained in Example 2 and those obtained by the conventional method were subjected to an oxidizing treatment at 1,000° C. for 16 hours in a furnace filled with an oxygen atmosphere. Results were such that the concentration of oxidation-induced stacking faults of the silicon wafers obtained in Example 2 was 1 cm$^{-2}$ while that of the silicon wafers obtained by the conventional method was 10 cm$^{-2}$.

EXAMPLE 4 AND COMPARATIVE EXAMPLE 2

Silicon wafers obtained in Example 2 and those obtained by the conventional method (i.e., silicon wafers prepared in the same manner as in Example 3 and Comparative Example 1) were oxidized at 950° C. for 30 minutes in a heat treatment furnace filled with a dried oxygen atmosphere containing a HCl gas at 10 wt %, so that a 20-nm-thick oxide film was formed on each wafer, Each wafer was then formed with a MOS capacitor, and a breakdown voltage characteristic of each oxide film was measured. Results were such that the C-mode frequency of the wafers obtained in Example 2 was not lower than 98% while that of the wafers obtained by the conventional method was 92%.

From the above Examples and Comparative Examples, it is understood that a stepped structure of a slant surface that is produced by inclined slicing at a given inclination angle and a hydrogen heat treatment is constituted of step walls Sa, and that a wafer having such a stepped structure allows formation of an oxide film that is free of defects and exhibits superior characteristics.

According to this embodiment, a silicon wafer can be produced easily with a given inclined slicing angle. Having superior surface characteristics, a silicon wafer of this is embodiment can be suitably used as a semiconductor substrate.

EMBODIMENT 3

A silicon wafer of this embodiment is provided with a desired stepped structure such that a slant crystal surface is formed by slicing at a given angle and then a crystal surface is reconstructed by a heat treatment in an argon or hydrogen atmosphere. While each step wall of the stepped structure extends differently, that is, parallel with or perpendicularly to rows of silicon atom dimers in the corresponding step layer depending on the slicing angle and the heat treatment atmosphere, the top surface of each step layer assumes a substantially uniform, smooth surface. Since an active region for electron transport is formed in such a step layer, a high-performance semiconductor device can be formed which is not affected by the surface roughness.

The stepped structure of this embodiment is formed by atomic reconstruction of a silicon wafer surface, and is different from a surface produced by working such as mirror-polishing. A worked surface has a feature that atoms are arranged randomly, and is usually represented by roughness. It is well known that surface roughness is one of factors that deteriorate surface-related device characteristics. On the other hand, a reconstructed surface is constructed by a new lattice (superlattice). Due to arbitrariness in a superlattice formation process, that is, depending on a surface orientation of a silicon wafer, a slicing angle, heat treatment conditions, and other factors, different kinds of domains are generated which have different superlattice crystal orientations. Superlattice domains have atomic-level surfaces, and a step wall is formed between adjacent domains. Like the surface roughness of a worked surface, this type of stepped structure greatly influences surface-related device characteristics.

In this embodiment, step walls of a stepped structure are arranged in a particular direction by performing a proper process, and a device active region is formed in a single step layer, i.e., domain, which is an atomic-level smooth surface. Therefore, influences on semiconductor device performance of a stepped structure including step walls that are formed between adjacent domains can be suppressed.

Thus, the semiconductor device of this embodiment can improve all kinds of device performance that are influenced by surface properties of a silicon substrate, such as a carrier mobility in a channel, a breakdown voltage of a gate insulating film, etc.

In this embodiment, there is no particular limitations on the type of a silicon wafer but there may be used various types of silicon wafers, for instance, a silicon wafer of plane (001) (equivalent to (100) that is commonly used in the art to refer to this group of equivalent planes) obtained by slicing a silicon single crystal that has been produced by the Czochralski method (CZ method).

In this embodiment, a slant crystal surface is formed by slicing off a silicon wafer that is inclined such that its normal is inclined toward direction [110] in an angular range of 0.01° to 5°. If the inclination angle is not larger than 5°, a stepped structure of this embodiment can be controlled properly. On the other hand, at present, it is difficult to mechanically control the inclination angle in a range smaller than 0.01°. If the inclining direction from direction [001] is not toward direction [110], no regular steps are formed. However, the inclining direction is not required to be exactly toward direction [110], but it suffices that the inclining direction is substantially toward direction [110]. Specifically, the inclining direction may be deviated toward direction [$\overline{1}$10] by about ±2°.

A wafer that has been sliced off with inclination is cleaned by a cleaning method of a known silicon wafer manufacturing process, for instance, a method using a mixture of hydrofluoric acid and nitric acid, and then subjected to a proper heat treatment. It is preferred that the heat treatment atmosphere be an argon or hydrogen atmosphere. An obtained stepped structure depends on the inclined slicing angle and the kind of atmosphere gas.

The fact that an obtained stepped structure depends on the inclined slicing angle and the kind of heat treatment atmosphere has been first found by the inventors. For example, as described in the first and second embodiments, steps Sa and Sb are formed by inclined slicing of a very small angle and a heat treatment in an argon atmosphere, and only step walls Sa are formed by inclined slicing of a very small angle and a heat treatment in a hydrogen atmosphere. In this embodiment, a stepped structure may be constituted of either steps Sa or Sb, or both of steps Sa and Sb, and an active region for electron transport may be formed in the same step layer having an atomic-level smooth surface. The terms steps Sa and Sb used in this embodiment are according to the definitions in Report (1) by Chadi.

The heat treatment temperature is set at 600–1,300° C. A process temperature higher than 1,300° C. is not practical because the life of a quartz core tube is likely shortened. If the process temperature is lower than 600° C., the reconstruction rate of a silicon surface is low. The heat treatment period may be set properly in accordance with the surface structure of a silicon wafer to be processed, the inclination angle, and the structure of a sliced surface. Usually it is set at 5–240 minutes.

Figure 7:
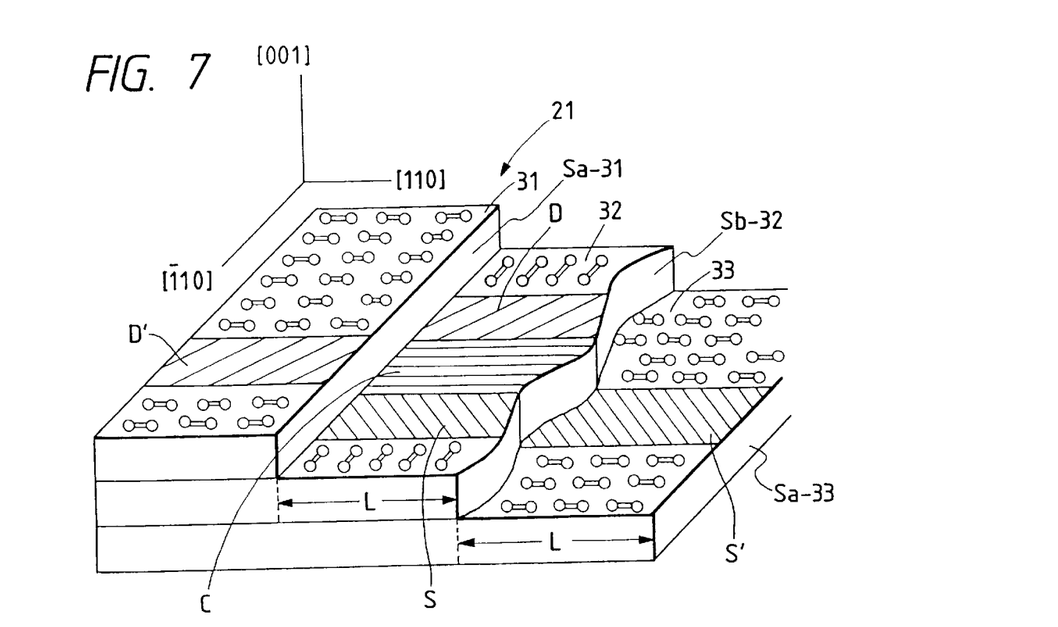
FIG. 7 schematically illustrates an example of a stepped crystal structure formed on a slant-surface silicon wafer obtained by inclined slicing and a MOS device formed in the stepped crystal structure according to a third embodiment of the invention.

FIG. 7 schematically illustrates an example of a stepped crystal structure formed on a slant-surface silicon wafer obtained by inclined slicing and a MOS device formed in the stepped crystal structure.

In FIG. 7, a stepped structure is formed in which step surfaces 31–33 and step walls Sa-31, Sb-32 and Sa-33 extend in direction [$\bar{1}00$] by performing a heat treatment at 1,200° C. in an argon atmosphere on a silicon wafer having a slant surface that is so inclined from plane (001) that its normal is inclined toward a particular direction, for instance, direction [110] by an inclination angle θ of 0.01° to 5°. This stepped structure is characterized by the flat step walls Sa and the curved step walls Sb which are generally parallel with each other. An interval L between adjacent step walls is determined by the inclination angle θ and expressed as L={(lattice constant)/4}/tan θ.

Usually, step surfaces obtained by subjecting the silicon wafer having the stepped structure of FIG. 7 to a prescribed cleaning step and an oxidizing step are rough or smooth depending on the roughness of boundary surfaces between the silicon wafer and an oxide film. Since the step surfaces 31–33 are parallel with each other, if the boundary surfaces are rough, rough portions also extend parallel with each other on each step surface and therefore boundary scattering centers due to the rough portions are distributed along direction [$\bar{1}10$]. Therefore, if it is intended to move carriers in direction [$\bar{1}10$], the boundary rough portions between the oxide film and the respective step surfaces exert strong scattering on carriers as if to be a periodical energy band.

In contrast, in this embodiment, carriers are not affected by boundary scattering in a step surface, because a source S and a drain D of a MOS device are so arranged as to move carriers in direction [$\bar{1}10$] by utilizing a stepped structure reconstructed on a slant-surface silicon wafer. That is, even if boundary scattering occurs, it is weaker for carriers moving within the same surface than for those moving in other directions because fields cancel out each other in the same surface. In other words, by causing carriers to move in a direction that does not intersect any step walls, the possibility that carriers collide with strong scattering centers can be reduced. Thus, by forming a channel C of the MOS device parallel with direction [$\bar{1}10$], a high drift mobility of carriers can be obtained therein, to thereby increase the operation speed of the MOS device.

Figure 8:
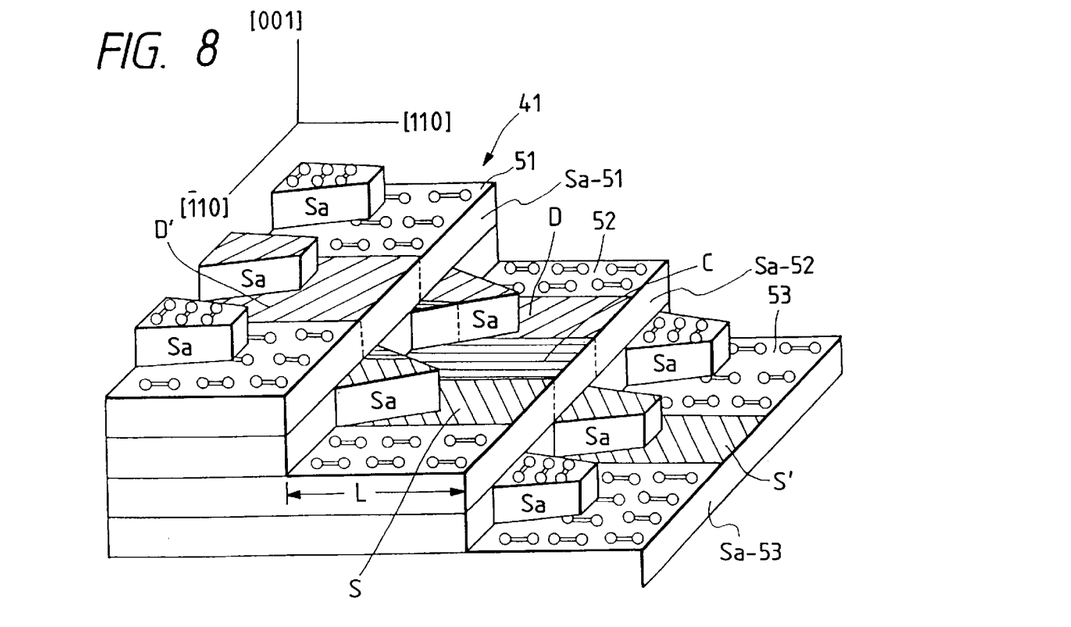
FIG. 8 schematically illustrates another example of a stepped crystal structure formed on a slant-surface silicon wafer obtained by inclined slicing and a MOS device formed in the stepped crystal structure according to the third embodiment of the invention.

FIG. 8 schematically illustrates another example of a stepped crystal structure formed on a slant-surface silicon wafer obtained by inclined slicing and a MOS device formed in the stepped crystal structure.

In FIG. 8, a stepped structure is formed in which step surfaces 51–53 and step walls Sa-51, Sb-52 and Sa-53 extend in direction [$\bar{1}00$] and partial step walls Sa exist on each step surface, by performing a heat treatment at 1,200° C. in a hydrogen atmosphere on a silicon wafer having a slant surface that is so inclined from plane (001) that its normal is inclined toward a particular direction, for instance, direction [110] by an inclination angle θ of 0.01° to 0.2°. This stepped structure is characterized by being constituted almost only of flat step walls Sa that are parallel with each other. An interval L between adjacent ones of the step walls Sa-51, Sa-52 and Sa-53 is determined by the inclination angle e and expressed as L={(lattice constant)/2}/tan θ.

In the stepped structure of FIG. 8 as in the case of FIG. 7, by arranging a source S and a drain D so as to cause carriers to move in direction [110], carriers are entirely prevented from being affected by boundary scattering in the step surface. As a result, a high drift mobility of carriers can be obtained in a channel C, so that the operation speed of the MOS device can be increased.

EXAMPLE 5 AND COMPARATIVE EXAMPLE 3

Silicon wafer samples used in this example were those obtained by slicing a 6-inch CZ silicon crystal at an inclination angle of 0.05° from the normal of plane (001) toward direction [110]. After silicon wafer samples were cleaned by an ordinary cleaning method using, for instance, a mixture of hydrofluoric acid and nitric acid and then heat-treated at 1,200° C. for one hour in an argon atmosphere.

AFM observation of the surfaces of the silicon wafers thus processed showed that they had a stepped structure with an interval L of about 0.2 μm.

Using the thus-processed silicon wafers as substrates, N-channel MOS devices were formed so as to extend in two different directions by a known method. More specifically, referring to FIG. 7, the channel C is shared between two MOS devices S-C-D and S'-C-D', which extend in directions respectively.

Figure 9:
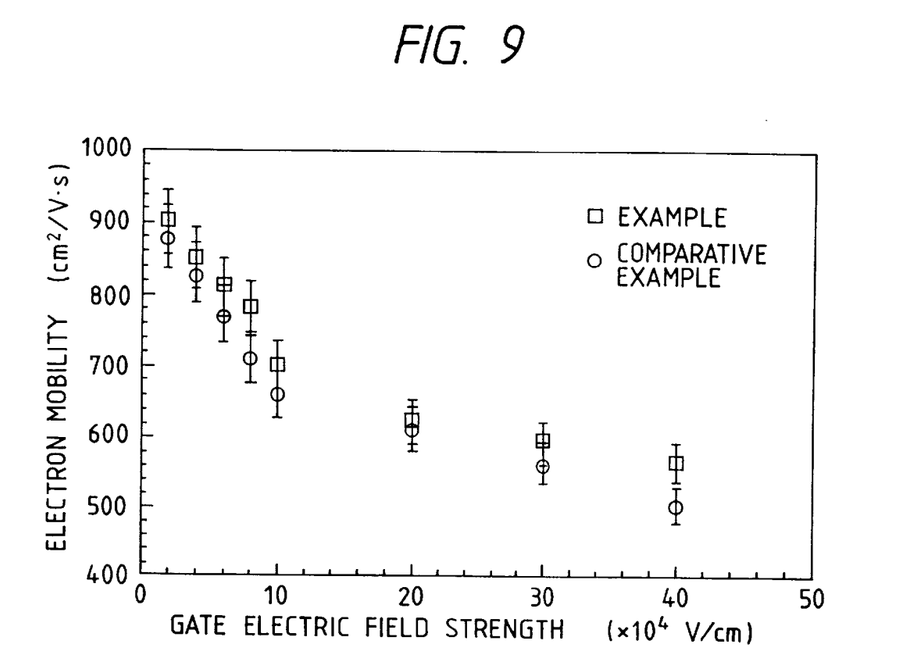
FIG. 9 is a graph showing a relationship between the strength of an electric field applied to a gate and the electron mobility of a channel in Example 5 and Comparative Example 3.

Electron mobilities of the channel C in directions [110] (Example 5) and [110] (Comparative Example 3) were measure while the strength of an electric field applied to a gate (not shown) was changed. FIG. 9 shows measurement results, from which it is seen that the electron mobilities obtained when the channel C used in direction [$\bar{1}10$], that is, when the MOS device is formed within the same step surface are larger than those obtained when the channel C is used in direction [110]. In Example 5 and Comparative Example 3, the N-channel MOS device had the following parameters:

Channel sizes 1 μm both in width and length
Wafer dopant/dose: boron/1×10$^{13}$ cm$^{-2}$
Thickness of oxide film on wafer: 3,000 Å
Channel dopant/dose: boron/2×10$^{11}$ cm$^{-2}$
Thickness of gate oxide film: 200 Å

According to this embodiment, a semiconductor device is formed by using, as a substrate, a slant-surface silicon wafer obtained such that after inclined slicing a desired stepped crystal structure is reconstructed by a prescribed heat treatment, and by forming an active region for electron transport within the same step surface of the stepped crystal structure. As a result, the electron mobility is increased, and the operation speed such as switching speed is thereby increased, contributing to provision of a high-performance integrated circuit.

What is claimed is:

1. A method for forming a slant-surface silicon wafer, comprising the steps of:
    slicing off a single crystal silicon wafer comprising a slant surface that is inclined from plane (001) such that a normal of the slant surface is inclined by 0.01° to 0.2° from direction [001] toward direction [110];
    cleaning the silicon wafer; and
    heat-treating the silicon wafer at 600–1,300° C. for not less than 1 minute in an ultrapure argon atmosphere containing nitrogen at not more than 0.1 ppm, to thereby cause the slant surface to have a stepped surface crystal structure including step walls Sa and Sb.

2. The method according to claim 1, further comprising the step of confirming formation of the stepped crystal structure by an observation with an interatomic force microscope.

3. A method for forming a slant-surface silicon wafer, comprising the steps of:

slicing off a single crystal silicon wafer comprising a slant surface that is inclined from plane (001) such that a normal of the slant surface is inclined by 0.01° to 0.2° from direction [001] toward direction [110];

cleaning the silicon wafer; and heat-treating the silicon wafer at 600–1,300° C. for not less than 1 minute in an ultrapure hydrogen atmosphere containing nitrogen at not more than 0.1 ppm, to thereby cause the slant surface to have a stepped surface crystal structure substantially all of whose step walls are step walls Sa.

4. The method according to claim 3, further comprising the step of confirming formation of the stepped crystal structure by an observation with an interatomic force microscope.

* * * * *